(12) United States Patent
Nguyen

(10) Patent No.: US 9,581,468 B2
(45) Date of Patent: Feb. 28, 2017

(54) METHODS FOR FABRICATING APPARATUS HAVING A HERMETIC SEAL

(71) Applicant: DunAn Sensing LLC, San Jose, CA (US)

(72) Inventor: Tom T. Nguyen, San Jose, CA (US)

(73) Assignee: DUNAN SENSING, LLC, San Jose, CA (US)

( * ) Notice: Subject to any disclaimer, the term of this patent is extended or adjusted under 35 U.S.C. 154(b) by 0 days.

(21) Appl. No.: 14/170,355

(22) Filed: Jan. 31, 2014

(65) Prior Publication Data
US 2015/0217416 A1    Aug. 6, 2015

(51) Int. Cl.
| | |
|---|---|
| G01D 11/24 | (2006.01) |
| H01L 23/10 | (2006.01) |
| G01L 19/14 | (2006.01) |
| G01L 19/06 | (2006.01) |
| G01L 5/16 | (2006.01) |
| B23P 11/00 | (2006.01) |
| G01D 11/26 | (2006.01) |
| B81B 7/00 | (2006.01) |
| B81C 1/00 | (2006.01) |

(52) U.S. Cl.
CPC .......... *G01D 11/245* (2013.01); *B23P 11/005* (2013.01); *G01D 11/26* (2013.01); *G01L 5/165* (2013.01); *G01L 19/0672* (2013.01); *G01L 19/14* (2013.01); *G01L 19/145* (2013.01); *H01L 23/10* (2013.01); *B81B 7/0032* (2013.01); *B81B 2201/0264* (2013.01); *B81C 1/00261* (2013.01); *Y10T 29/49872* (2015.01); *Y10T 29/49874* (2015.01); *Y10T 29/49913* (2015.01); *Y10T 29/49915* (2015.01)

(58) Field of Classification Search
CPC ...... B81C 2203/0172; B81C 2203/019; B81C 1/00261; B81C 1/00277; B81C 1/00293; B81C 1/00333; B81C 3/00; B81C 3/001; B81C 3/005; B81C 3/008; B81C 2203/054; B81B 7/0032; B81B 7/0035; B81B 7/0041; B81B 7/0077; B81B 2201/0264; G01L 19/14; G01L 19/142; G01L 19/143; G01L 19/147; G01L 19/145; G12B 9/06; B23P 11/005; Y10T 29/49808; Y10T 29/49913; Y10T 29/49927; H01L 23/02; H01L 23/04; H01L 23/10; G01D 11/24; G01D 11/245
USPC .......................................................... 73/37
See application file for complete search history.

(56) References Cited

U.S. PATENT DOCUMENTS

| | | | | |
|---|---|---|---|---|
| 4,833,922 | A * | 5/1989 | Frick et al. ............ | 73/756 |
| 4,888,662 | A * | 12/1989 | Bishop .................. | 361/283.1 |
| 4,903,164 | A * | 2/1990 | Bishop et al. ........ | 361/283.1 |
| 4,993,267 | A * | 2/1991 | Allard et al. ......... | 73/726 |
| 5,939,637 | A * | 8/1999 | Pitzer ............... | G01L 19/14 |
| | | | | 73/715 |

(Continued)

*Primary Examiner* — Christopher Besler
*Assistant Examiner* — Matthew P Travers
(74) *Attorney, Agent, or Firm* — Hackler Daghighian Martino & Novak

(57) ABSTRACT

Methods for fabricating a hermetic seal to seal a portion of an apparatus, for example and without limitation, a portion having a MEMS sensor. One such method uses crimping devices to compress a seal in a cavity formed in a housing that includes a MEMS sensor attached to a stress isolator. Under such compression, the seal deforms to hermetically seal surfaces around the inside, outside and bottom of the stress isolator.

20 Claims, 10 Drawing Sheets

(56) References Cited

U.S. PATENT DOCUMENTS

| | | |
|---|---|---|
| 6,209,399 B1* | 4/2001 | Probst et al. .................... 73/756 |
| 2003/0154795 A1* | 8/2003 | Pitzer ............................... 73/715 |
| 2005/0061080 A1* | 3/2005 | Sasaki et al. .................... 73/754 |
| 2006/0115323 A1* | 6/2006 | Coppeta ............... A61K 9/0097 |
| | | 403/270 |
| 2008/0099861 A1* | 5/2008 | Dangtran ................ G01P 1/023 |
| | | 257/415 |
| 2008/0236290 A1* | 10/2008 | Iimori et al. .................... 73/715 |
| 2009/0049921 A1* | 2/2009 | Otsuka et al. .................. 73/706 |
| 2013/0000413 A1* | 1/2013 | Mitchell et al. ................ 73/756 |
| 2013/0031984 A1* | 2/2013 | Jones et al. ..................... 73/717 |

* cited by examiner

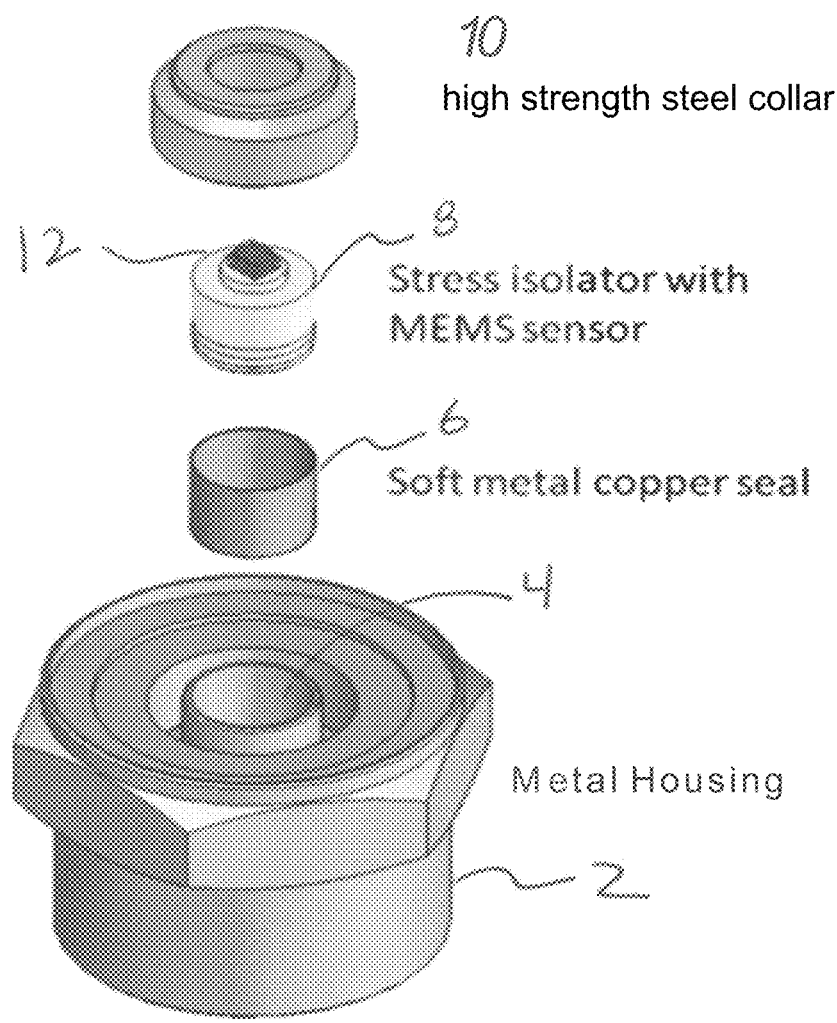
Fig. 2 Radial Seal

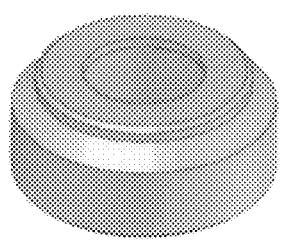
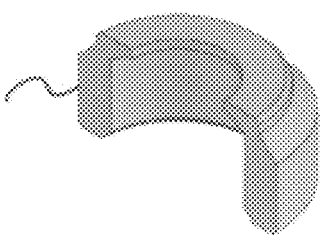
Fig. 3A							Fig. 3B
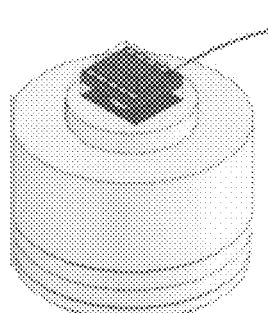
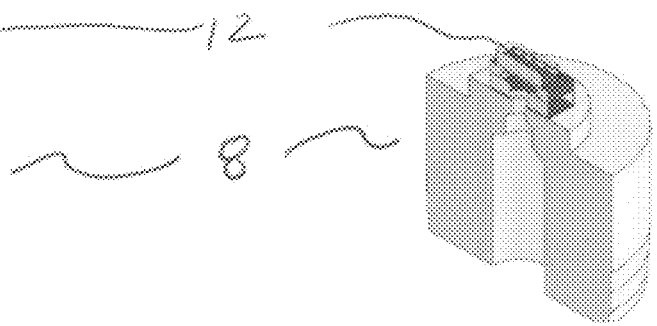
Fig. 4A							Fig. 4B
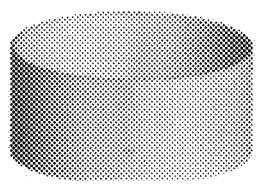
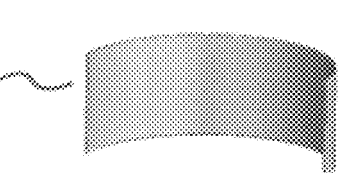
Fig. 5A							Fig. 5B
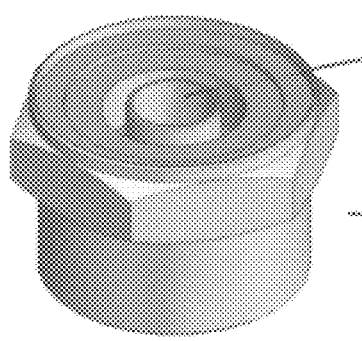
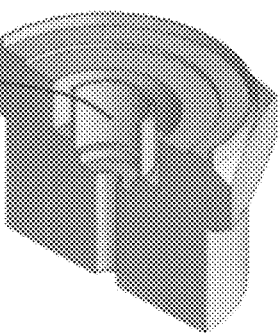
Fig. 6A							Fig. 6B

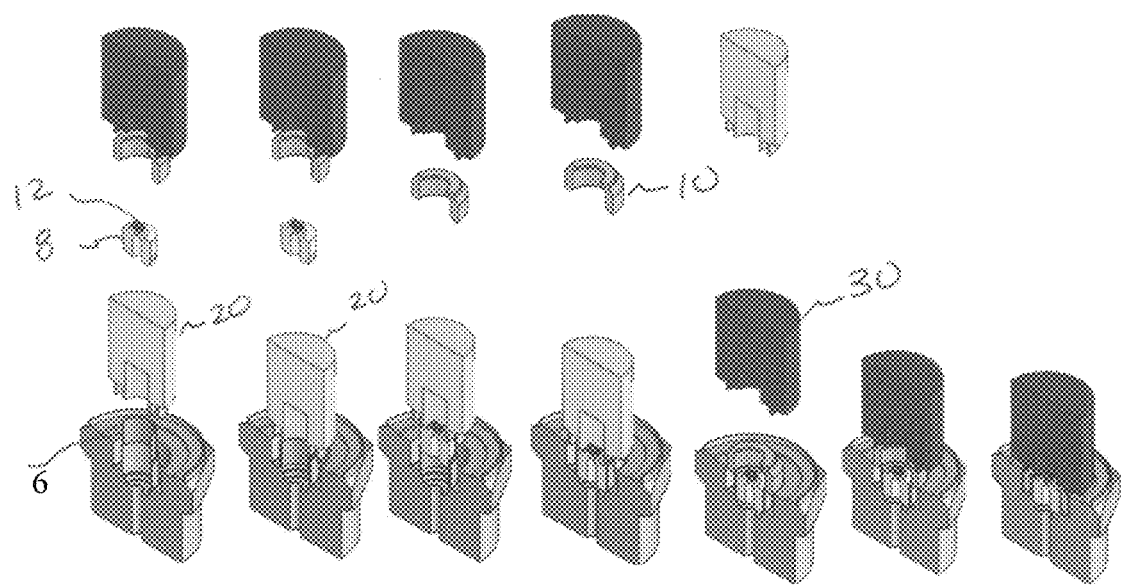
Fig. 7  Radial Seal Crimping Process

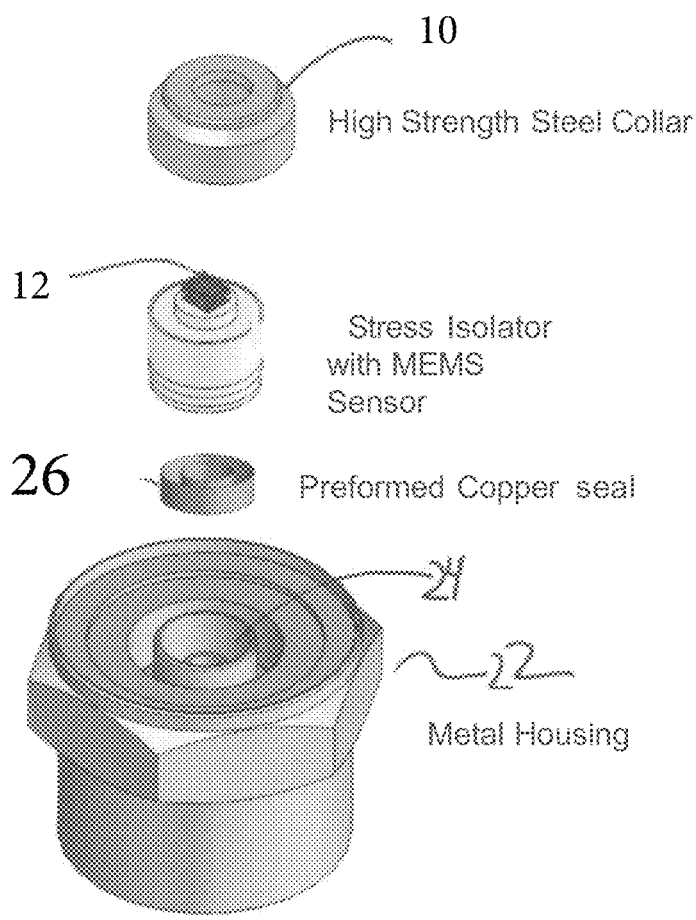
Fig. 8   Complete Seal

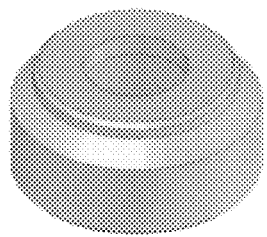
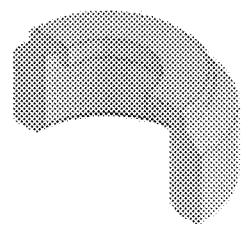
Fig.9A                    Fig. 9B
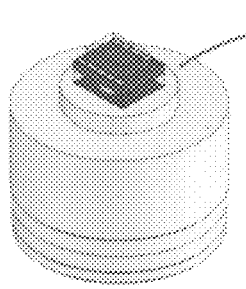
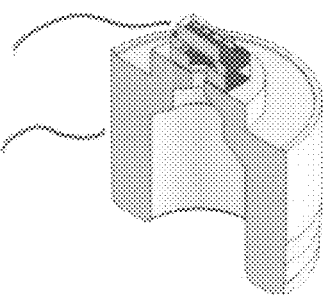
Fig.10A                   Fig. 10B
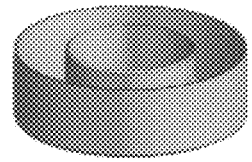
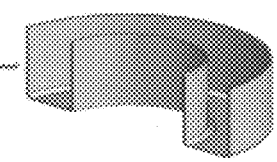
Fig.11A                   Fig. 11B
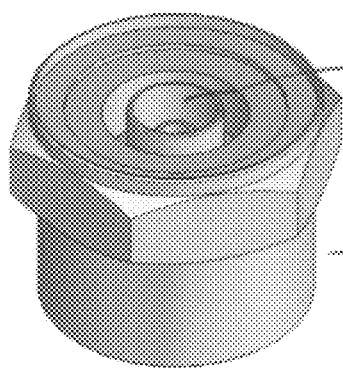
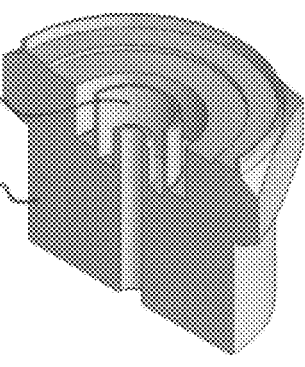
Fig.12A                   Fig. 12B

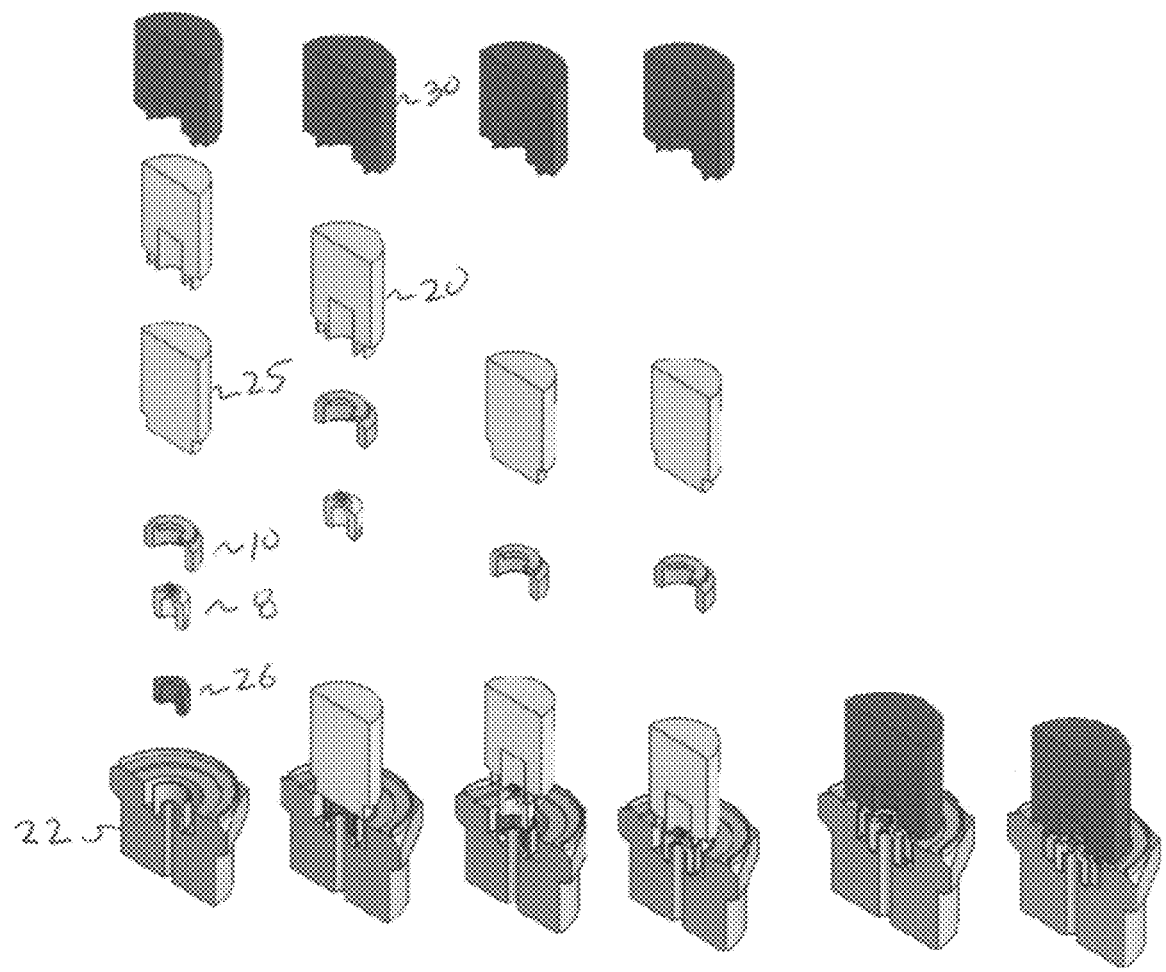
Fig. 13 Complete Seal Crimping Process

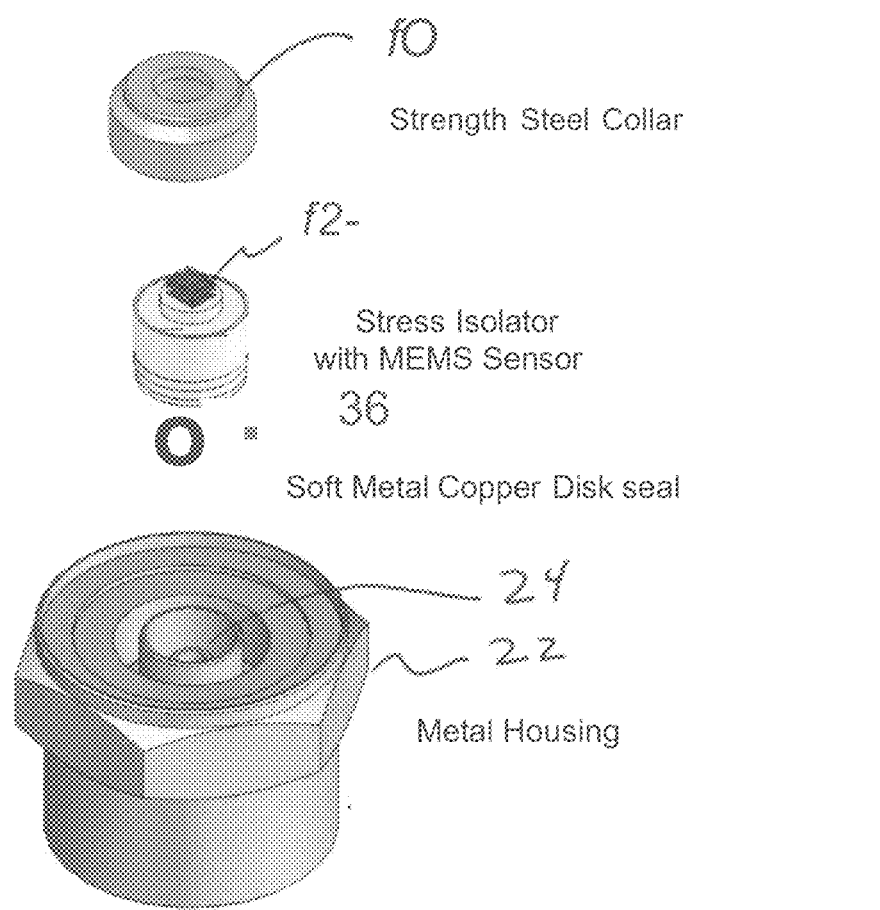
Fig. 14 Face Seal

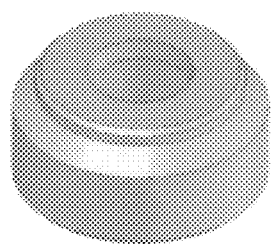 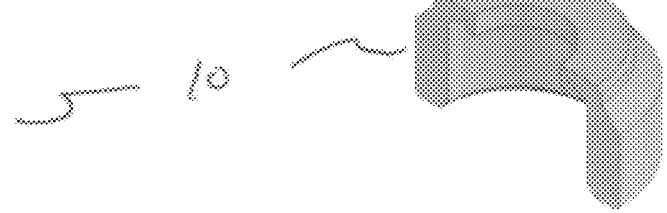
Fig.15A    Fig. 15B
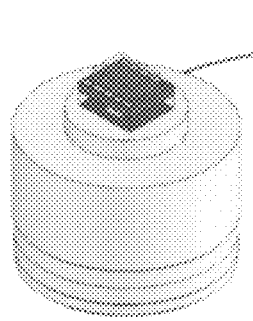 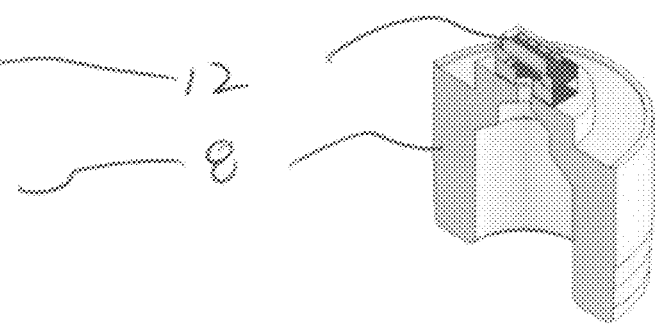
Fig.16A    Fig. 16B
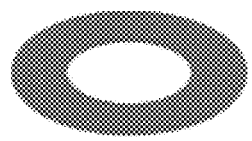 
Fig.17A    Fig. 17B
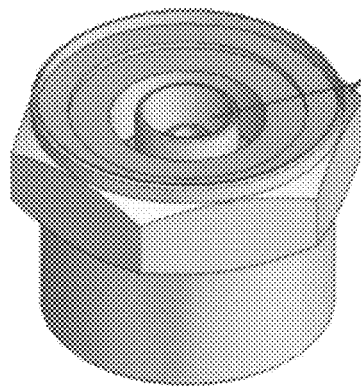 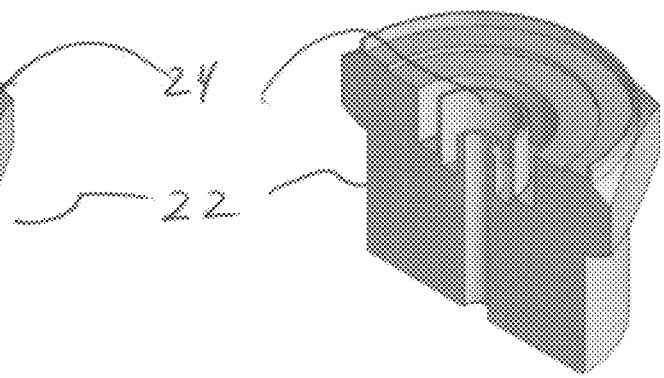
Fig.18A    Fig. 18B

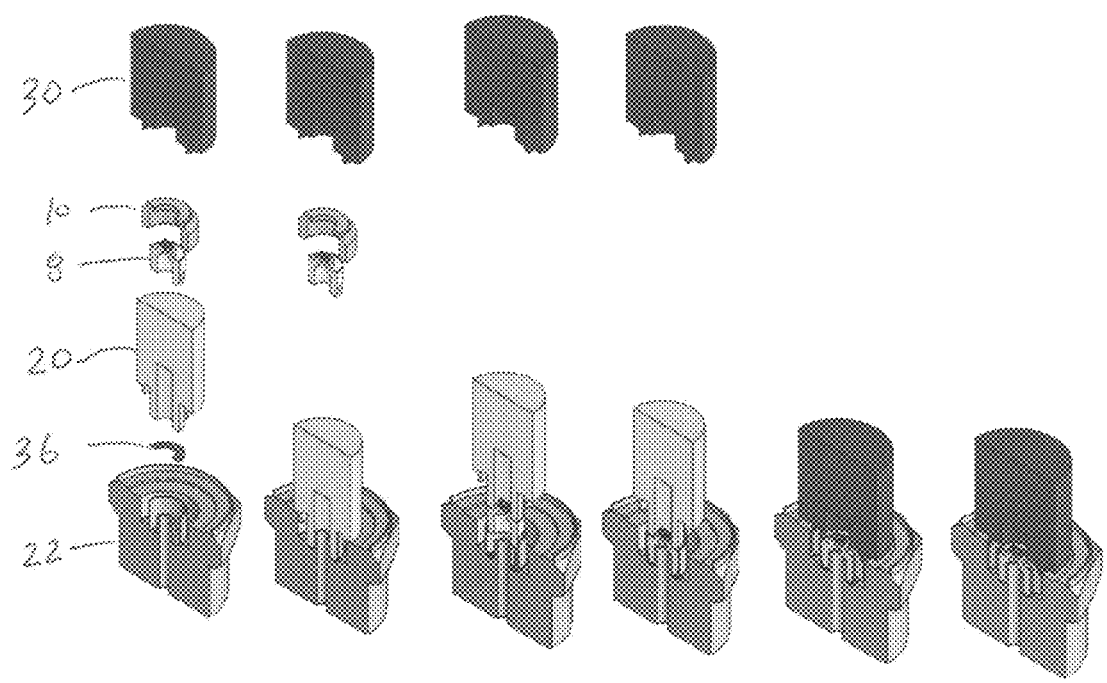
Fig. 19 Face Seal Crimping Process

METHODS FOR FABRICATING APPARATUS HAVING A HERMETIC SEAL

TECHNICAL FIELD

One or more embodiments relate to apparatus having a hermetic or airtight seal, and one or more further embodiments relate to methods of fabricating such apparatus.

BACKGROUND

Many conventional methods exist for forming seals which prevent leakage of liquid, gas, and the like from one section of a package to another. For example, conventional methods for forming seals entail: (a) using O-rings; (b) welding; (c) soldering; and (d) gluing. Many such conventional methods are acceptable in environments where sealing is not very sensitive or important. However, in many environments, including those where sensors are placed along different sections of a package to measure pressure, obtaining an airtight or hermetic seal is important and conventional methods are not adequate.

In typical conventional pressure sensor devices, a convoluted, thin, metal diaphragm is welded in a pressure path to seal (so as to reduce leakage of gas from) a gas-filled chamber. In manufacturing other types of conventional pressure sensor devices, a metal housing is fabricated using stainless steel alloys (due to their anti-corrosion characteristics). In such cases, a sealing method typically entails the use of a laser beam or an electron beam ("e-beam") to melt the metal to form a hermetic seal.

A MEMS ("Micro-Electro-Mechanical Systems") pressure sensor device uses a silicon base which is mounted on a metal, for example, Kovar or Invar, whose coefficient of thermal expansion closely matches that of the silicon base (in general, stainless steel alloys cannot be used). Due to continuing requirements for low cost pressure sensor devices, it is desirable that a metallic housing for such devices be made from materials such as brass, copper and aluminum, and not stainless steel. However, joining thermally matched metal (for example, Kovar or Invar) to a metallic housing (made, for example, of thermally mismatched metals such as brass, copper or aluminum) using a conventional laser welding method typically results in weld cracks. In other words, conventional laser welding methods used with these metals have been unsuccessful in forming hermetic seals. Further, alternate sealing methods such as brazing and soldering require processes at temperatures above 800° C., which high temperatures are unacceptable for use in fabricating MEMS sensor devices.

SUMMARY

One or more embodiments relate to apparatus having a hermetic seal such as, for example and without limitation, pressure sensor devices that include MEMS sensors. One or more further embodiments relate to methods for fabricating such apparatus such as, for example and without limitation, methods for fabricating pressure sensor devices that include MEMS sensors without damaging such sensors. In particular, one or more further embodiments of methods for fabricating entail the use different types of metal seals to seal portions of an apparatus so that MEMS sensors can be used. In further particular, one or more such further embodiments of methods for fabricating entail the use of crimping devices to pressure seal metal seals within the apparatus. In still further particular, one or more such further embodiments of methods for fabricating provide hermetic sealing by compression forces at a leak rate equal to welding methods, and which do not cause leakage.

BRIEF DESCRIPTION OF THE DRAWINGS

FIG. 2 is a perspective, exploded view of parts used to fabricate one of more first apparatus embodiments having a hermetic seal in accordance with a first process embodiment, i.e., using a radial seal;

FIG. 3A is a perspective view of a collar used to fabricate one or more embodiments;

FIG. 3B is a cross sectional view of the collar shown in FIG. 3A;

FIG. 4A is a perspective view of a stress isolator with an attached MEMS sensor that is used to fabricate one or more embodiments;

FIG. 4B is a cross sectional view of the stress isolator with an attached MEMS sensor shown in FIG. 4A;

FIG. 5A is a perspective view of a radial seal that is used to fabricate one or more first apparatus embodiments having a hermetic seal in accordance with the first process embodiment;

FIG. 5B is a cross sectional view of the radial seal shown in FIG. 5A;

FIG. 6A is a perspective view of a housing that used to fabricate one or more first apparatus embodiments having a hermetic seal in accordance with the first process embodiment;

FIG. 6B is a cross sectional view of the housing shown in FIG. 6A;

FIG. 7 is an illustration of steps of a radial seal crimping process that are carried out in accordance with one or more first process embodiments to fabricate one or more first apparatus embodiments;

FIG. 8 is a perspective, exploded view of parts used to fabricate one or more second apparatus embodiments having a hermetic seal in accordance with a second process embodiment, i.e., using a "complete" seal;

FIG. 9A is a perspective view of a collar used to fabricate one or more embodiments;

FIG. 9B is a cross sectional view of the collar shown in FIG. 9A;

FIG. 10A is a perspective view of a stress isolator with an attached MEMS sensor that is used to fabricate one or more embodiments;

FIG. 10B is a cross sectional view of the stress isolator with an attached MEMS sensor shown in FIG. 10A;

FIG. 11A is a perspective view of a "complete" seal that is used to fabricate one or more second apparatus embodiments having a hermetic seal in accordance with the second embodiment;

FIG. 11B is a cross sectional view of the "complete" seal shown in FIG. 11A;

FIG. 12A is a perspective view of a housing that is used to fabricate one or more second apparatus embodiments having a hermetic seal in accordance with the second embodiment;

FIG. 12B is a cross sectional view of the housing shown in FIG. 12A;

FIG. 13 is an illustration of steps of a "complete" seal crimping process that are carried out in accordance with one or more second process embodiments to fabricate one or more second apparatus embodiments;

FIG. 14 is a perspective, exploded view of parts used to fabricate one or more third apparatus embodiments having a hermetic seal in accordance with a third process embodiment, i.e., using a "face" seal;

FIG. 15A is a perspective view of a collar used to fabricate one or more embodiments;

FIG. 15B is a cross sectional view of the collar shown in FIG. 15A;

FIG. 16A is a perspective view of a stress isolator with an attached MEMS sensor that is used to fabricate one or more embodiments;

FIG. 16B is a cross sectional view of the stress isolator with an attached MEMS sensor shown in FIG. 16A;

FIG. 17A is a perspective view of a "face" seal that is used to fabricate one or more first apparatus embodiments having a hermetic seal in accordance with the third process embodiment;

FIG. 17B is a cross sectional view of the "face" seal shown in FIG. 17A;

FIG. 18A is a perspective view of a housing that is used to fabricate one or more second apparatus embodiments having a hermetic seal in accordance with the second and the third process embodiments;

FIG. 18B is a cross sectional view of the housing shown in FIG. 18A; and

FIG. 19 is an illustration of steps of a "face" seal crimping process that are carried out in accordance with one or more third embodiments to fabricate one or more third apparatus embodiments.

DETAILED DESCRIPTION

Figure 1A:
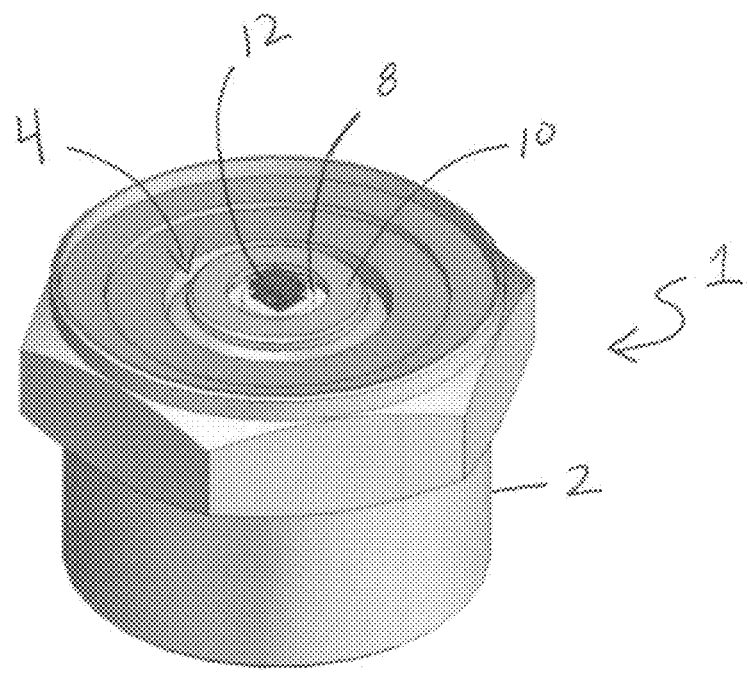
FIG. 1A is a perspective view of an apparatus having a hermetic seal that is fabricated in accordance with one or more embodiments.

Embodiments will be described with reference to the figures, wherein like components, parts, and so forth are designated by like reference numerals throughout the various figures. Further, specific parameters such as pressure values, materials, size, dimensions, shapes, and the like are provided herein, and are intended to be explanatory rather than limiting.

One or more process embodiments are directed to methods for forming a hermetic seal to seal a portion of an apparatus (such as, for example and without limitation, a pressure sensor apparatus or device), and in particular, a portion such as, for example and without limitation, a portion having a MEMS ("Micro-Electro-Mechanical Systems") sensor. In accordance with one or more such process embodiments, the methods entail forming a hermetic seal by deforming a seal in a cavity formed in a housing that includes a MEMS sensor attached to a stress isolator. In accordance with one or more such process embodiments, the seal can be made of metal, which metal is preferably a soft metal such as, for example and without limitation, copper or copper alloy. However, one or more further process embodiments include the use of other metals or non-metals capable of forming a hermetic seal. It is believed that one or more of the process embodiments act provide an airtight or hermetic seal by using mechanical pressure to "melt" or "soft anneal" a metal seal (i.e., to form a "solder-like" seal which is airtight or hermetic).

In addition, one or more apparatus embodiments are directed to apparatus having a hermetic seal that seals a portion of the apparatus, and in particular, a portion such as, for example and without limitation, a portion having a MEMS sensor.

FIG. 1A is a perspective view of apparatus 1 which has a hermetic seal and which is fabricated in accordance with one or more process embodiments. As shown in FIG. 1A, apparatus 1 includes: housing 2 having cavity 4 therein, stress isolator 8 with attached MEMS sensor 12, and collar 10. MEMS sensor 12 is typically used to sense and measure the pressure of a fluid or liquid. Not shown in FIG. 1A is a hermetic seal disposed between stress isolator 8 and an inner wall of cavity 4.

Figure 1B:
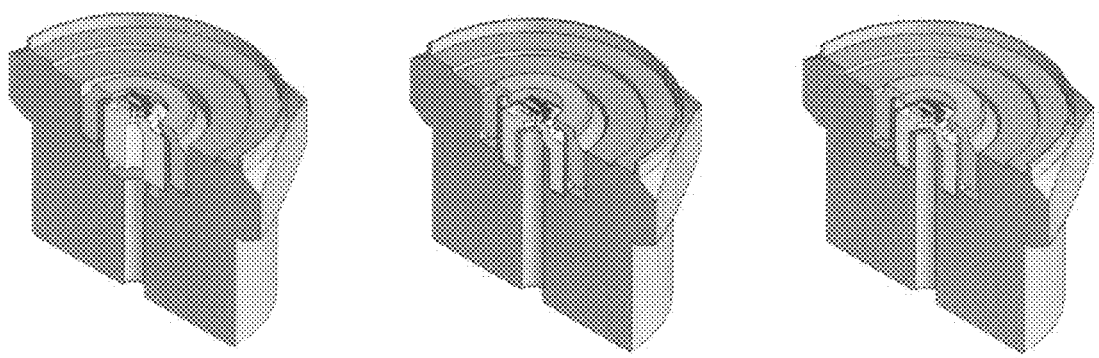
FIG. 1B shows cross sectional views of three apparatus embodiments of the apparatus shown in FIG. 1A—a first apparatus embodiment that is fabricated in accordance with a first process embodiment that uses a radial seal, a second apparatus embodiment that is fabricated in accordance with a second process embodiment that uses a "complete" seal, and a third apparatus embodiment that is fabricated in accordance with a third process embodiment that uses a "face" seal.

FIG. 1B shows cross sectional views of three apparatus embodiments of apparatus 1 shown in FIG. 1A. The first apparatus embodiment shown in FIG. 1B is fabricated in accordance with a first process embodiment that uses a radial seal, and is described below with reference to FIGS. 2-7; the second apparatus embodiment shown in FIG. 1B is fabricated in accordance with a second process embodiment that uses a "complete" seal, and is described below with reference to FIGS. 8-13; and the third apparatus embodiment shown in FIG. 1B is fabricated in accordance with a third process embodiment that uses a "face" seal, and is described below with reference to FIGS. 14-19.

FIG. 2 is a perspective, exploded view of parts used to fabricate one or more first embodiments of a pressure sensor apparatus having a hermetic seal in accordance with the first process embodiment, i.e., using a radial seal. As shown in FIG. 2, cavity 4 is formed in housing 2 (for example and without limitation, a metal housing) of the apparatus. In accordance with this first apparatus embodiment, and as further shown in FIG. 2, the first apparatus embodiment is fabricated using radial seal 6 (formed, for example and without limitation, of a soft metal such as copper), stress isolator 8, and collar 10 (formed, for example and without limitation, of high strength steel). As further shown in FIG. 2, MEMS sensor 12 is attached to stress isolator 8.

FIG. 3A is a perspective view of collar 10, and FIG. 3B is a cross sectional view of collar 10; FIG. 4A is a perspective view of stress isolator 8 with attached MEMS sensor 12, and FIG. 4B is a cross sectional view of stress isolator 8 with attached MEMS sensor 12; FIG. 5A is a perspective view of radial seal 6, and FIG. 5B is a cross sectional view of radial seal 6; and FIG. 6A is a perspective view of housing 2 having cavity 4 disposed therewithin, and FIG. 6B is a cross sectional view of housing 2 having cavity 4 disposed therewithin.

In accordance with one or more such first apparatus embodiments, housing 2 can be made of a metal, such as, for example and without limitation, stainless steel, brass, and aluminum or it may be fabricated as a plastic molded part having a metal insert. In addition, housing 2 can be made of other materials or metal composites so long as they are capable of withstanding the stress and strain of the fabrication process described herein, and they have material characteristics suitable to maintaining the hermetic seal. In further addition, housing 2 includes cavity 4. In accordance with one or more such embodiments, the walls of cavity 4 may have any shape that is suitable to accept radial seal 6 snugly therein (as used herein, the term snugly refers to a tight fit, but not so tight as requiring a press fit). Note that for this embodiment, an aperture in housing 2 that extends to the bottom of cavity 4 (refer to FIG. 6B) does not extend up into, and between the walls of, cavity 4.

In accordance with one or more embodiments, stress isolator 8 is made of a metal having a low coefficient of thermal expansion, and stress isolator has a diameter that is smaller than the diameter of cavity 4. In accordance with one or more such embodiments, a suitable metal having a suitably low coefficient of thermal expansion can be, for example and without limitation, an iron base alloy such as, for example and without limitation, Invar or a Kovar alloy containing, by weight, 42% nickel and the balance iron.

In accordance with one or more embodiments, collar 10 can be made from high strength stainless steel such as, for example and without limitation, alloys and machine-able stainless steels like SUS300 series, SUS400 series, and SUS600 series stainless steels. In accordance with one or more embodiments, collar 10 has walls that fit snugly around the outer walls of cavity 4.

In accordance with one or more such first apparatus embodiments, radial seal 6 (illustrated in FIGS. 5A and 5B) can be made from a metal such as, for example and without limitation, soft copper—where the term soft copper generally means about 100% copper and little or no other alloy. In addition, radial seal 6 can be made from other materials such as, for example and without limitation, Teflon, aluminum, and any other soft metal materials such as soft copper alloys. When the apparatus is assembled in accordance with one or more first process embodiments, radial seal 6 surrounds, or encapsulates stress isolator 8, in a radial manner. In accordance with one or more embodiments, the diameter of radial seal 6 is smaller than the diameter of cavity 4, but is larger than the diameter of stress isolator 8 to create a snug fit between the two. In accordance with one or more embodiments, although radial seal 6 is shown as having a cylindrical shape, radial seal 6 is not limited to this shape. In accordance with one or more embodiments, the walls of radial seal 6 do not extend to the top of the walls of cavity 4.

Although FIG. 4A shows MEMS sensor 12 attached to the top of stress isolator 8, further embodiments exist where MEMS sensor is placed at locations on stress isolator 8 other that at the top thereof. In accordance with one or more embodiments, MEMS sensor 12 can be any conventional MEMS sensor currently available. In addition, in accordance with one or more embodiments, stress isolator 8 can be shaped in any manner so long as it can be surrounded by radial seal 6.

FIG. 7 is an illustration of steps (of a radial seal crimping process) that are carried out in accordance with one or more first process embodiments to fabricate one or more first apparatus embodiments. First, first crimper 20 is used to place radial seal 6 within cavity 4 of housing 2. Next, first crimper 20 is used to place stress isolator 8 with attached MEMS sensor 12 within radial seal 6 in cavity 4. Next, first crimper 20 is used to exert pressure on top of stress isolator 8 (for example and without limitation, a pressure of about 0.5 ton psi) to press stress isolator 8 and attached MEMS sensor 12 down completely inside radial seal 6. Next, second crimper 30 is used to place collar 10 above stress isolator 8 so that its walls extend around the outer wall of cavity 4. Next, second crimper 30 is used to exert pressure on top of collar 10 (for example and without limitation, a pressure of about 2 tons psi) so that the walls of cavity 4 are crimped down (also referred to as compressed down) on radial seal 6 and stress isolator 8. In response, radial seal 6 is deformed and it fills gaps (it is believed to have "melted") between the outside of stress isolator 8 and the inner walls of cavity 4, and the walls of cavity 4 are crimped down on stress isolator 8 to provide a retaining force therefor within housing 2—this retaining force prevents stress isolator 8 from being evicted from cavity 4 under applied pressure of gas or liquid. As a result, radial seal 6 has been deformed to provide a hermetic and airtight seal in cavity 4 of housing 2 between the outer wall of stress isolator 8, radial seal 6, and the inner wall of cavity 4. In other words, a metal seal is compressed in a cavity bounded by cavity walls that is formed in a housing, which housing also includes a sensor attached to a stress isolator (also referred to as an stress isolator pedestal), i.e., an external crimper is press fitted outside the cavity walls, and as a result, the cavity walls are bent down on the stress isolator pedestal and, a retaining force is exerted on the stress isolator pedestal.

FIG. 8 is a perspective, exploded view of parts used to fabricate one or more second embodiments of a pressure sensor apparatus having a hermetic seal in accordance with the second process embodiment, i.e., using a "complete" seal. As shown in FIG. 8, the apparatus that is fabricated in accordance with the second process embodiment is similar to the apparatus described above that is fabricated in accordance with the first process embodiment, except that the housings and the seals are different from each other. In addition, as will be described further below, the crimping processes used to fabricate the respective hermetic seals are different.

As shown in FIG. 8, cavity 24 is formed in housing 22 (for example and without limitation, a metal housing) of the apparatus. In accordance with this second apparatus embodiment, and as further shown in FIG. 8, the second apparatus embodiment is fabricated using "complete" seal 26 (formed, for example and without limitation, of a soft metal such as copper), stress isolator 8, and collar 10 (formed, for example and without limitation, of high strength steel). As further shown in FIG. 8, MEMS sensor 12 is attached to stress isolator 8 as was described above with respect to the first apparatus embodiment.

FIG. 9A is a perspective view of collar 10, and FIG. 9B is a cross sectional view of collar 10; FIG. 10A is a perspective view of stress isolator 8 with attached MEMS sensor 12, and FIG. 10B is a cross sectional view of stress isolator 8 with attached MEMS sensor 12; FIG. 11A is a perspective view of "complete" seal 26, and FIG. 11B is a cross sectional view of "complete" seal 26; and FIG. 12A is a perspective view of housing 22 having cavity 24 disposed therewithin, and FIG. 12B is a cross sectional view of housing 22 having cavity 24 disposed therewithin.

The materials of which collar 10 and stress isolator 8 with attached MEMS sensor 12 are fabricated have been described above.

In accordance with one or more such second apparatus embodiments, housing 22 can be made of metal, such as, for example and without limitation, stainless steel, brass, and aluminum or it may be fabricated as a plastic molded part having a metal insert. In addition, housing 22 can be made of other materials or metal composites so long as they are capable of withstanding the stress and strain of the fabrication process described herein, and they have material characteristics suitable to maintaining the hermetic seal. In further addition, housing 22 includes cavity 24. In accordance with one or more such embodiments, cavity 24 may have any shape that is suitable to accept "complete" seal 26 snugly therein. Note that for this embodiment, duct (or pipe) in housing 22 that extends into cavity 24 (refer to FIG. 12B).

In accordance with one or more such second apparatus embodiments, "complete" seal 26 (illustrated in FIGS. 11A and 11B) can be made from a metal such as, for example and without limitation, soft copper. In addition, "complete" seal 26 can be made from other materials such as, for example and without limitation, Teflon, aluminum, and other soft metal materials such as soft copper alloys. During apparatus assembly in accordance with one or more second process embodiments, stress isolator 8 sits snugly in, and on top of, "complete" seal 26 once they are placed within cavity 24 of housing 22. In accordance with one or more embodiments, "complete" seal 26 is shown as having a toroidal shape with an open top. However, "complete" seal 26 is not limited to this particular shape, and further embodiments exist where "complete" seal 26 may have any suitable shape so long as stress isolator 8 can fit in "complete" seal 26. In accordance with one or more embodiments, the walls of "complete" seal 26 do not extend to the top of the walls of cavity 24.

FIG. 13 is an illustration of steps (of a "complete" seal crimping process) that are carried out in accordance with one or more second process embodiments to fabricate one or more second apparatus embodiments. First, third crimper 25 is used to place "complete" seal 26 within cavity 24 of housing 22. Next, first crimper 20 is used to place stress isolator 8 with attached MEMS sensor 12 in "complete" seal 26 in cavity 24. Next, first crimper 20 is used to exert pressure on top of stress isolator 8 (for example and without limitation, a pressure of about 0.5 ton psi) to press stress isolator 8 and attached MEMS sensor 12 completely in between the walls or edges of "complete" seal 26. Next, second crimper 30 is used to place collar 10 above stress isolator 8 so that its walls extend around the outer wall of cavity 24. Next, second crimper 30 is used to exert pressure on top of collar 10 (for example and without limitation, a pressure of about 2 tons psi) so that the walls of cavity 24 are crimped down on "complete" seal 26 and stress isolator 8. In response, "complete" seal 26 is deformed and it fills gaps (it is believed to have "melted") between the outside of stress isolator 8 and the inner walls of cavity 24, and the walls of cavity 24 are crimped down on stress isolator 8 to provide a retaining force therefor within housing 22. As a result, "complete" seal 26 has been deformed to provide a hermetic and airtight seal in cavity 24 of housing 22 between the outer wall of stress isolator 8, "complete" seal 26, and the inner wall of cavity 24.

FIG. 14 is a perspective, exploded view of parts used to fabricate one or more third embodiments of a pressure sensor apparatus having a hermetic seal in accordance with the third process embodiment, i.e., using a "face" seal. As shown in FIG. 14, the apparatus that is fabricated in accordance with the third process embodiment is similar to the apparatus described above that is fabricated in accordance with the second process embodiment, except that the seals are different from each other. In addition, as will be described further below, the crimping processes used to fabricate the respective hermetic seals are different.

As shown in FIG. 14, cavity 24 is formed in housing 22. In accordance with this third apparatus embodiment, and as further shown in FIG. 14, the third apparatus embodiment is fabricated using "face" seal 36 (formed, for example and without limitation, of a soft metal such as copper), stress isolator 8, and collar 10 (formed, for example and without limitation, of high strength steel). As further shown in FIG. 14, MEMS sensor 12 is attached to stress isolator 8 as was described above with respect to the first apparatus embodiment.

FIG. 15A is a perspective view of collar 10, and FIG. 15B is a cross sectional view of collar 10; FIG. 16A is a perspective view of stress isolator 8 with attached MEMS sensor 12, and FIG. 16B is a cross sectional view of stress isolator 8 with attached MEMS sensor 12; FIG. 17A is a perspective view of "face" seal 26, and FIG. 17B is a cross sectional view of "face" seal 36; and FIG. 18A is a perspective view of housing 22 having cavity 24 disposed therewithin, and FIG. 18B is a cross sectional view of housing 22 having cavity 24 disposed therewithin.

The materials of which collar 10 and stress isolator 8 with attached MEMS sensor 12 are fabricated have been described above. In addition, the materials of which housing 22 is fabricated have been described above. In accordance with one or more embodiments, cavity 24 may have any shape that is suitable to accept "face" seal snugly therein.

In accordance with one or more such third apparatus embodiments, "face" seal 36 (illustrated in FIGS. 17A and 17B) can be made from a metal such as, for example and without limitation, soft copper. In addition, "face" seal 36 can be made from other materials such as, for example and without limitation, Teflon, aluminum and any other soft metal materials. During apparatus assembly in accordance with one or more third process embodiments, stress isolator 8 sits snugly in cavity 24 on top of "face" seal 36 once they are placed in the cavity 24 of the housing 22. In accordance with one or more embodiments, "face" seal 36 is shown to be shaped as a disk. However, "face" seal 36 is not limited to this particular shape, and further embodiments exist where "face" seal may have any suitable shape so long as "face" seal 36 can sit snugly within the walls of cavity 24.

FIG. 19 is an illustration of steps (of a "face" seal crimping process) that are carried out in accordance with one or more third process embodiments to fabricate one or more third apparatus embodiments. First, first crimper 20 is used to place "face" seal 36 within cavity 24 of the housing 22. Next, first crimper 20 is used to place stress isolator 8 with attached MEMS sensor 12 in cavity 24. Next, first crimper 20 is used to exert pressure on top of stress isolator 8 (for example and without limitation, a pressure of about 0.5 ton psi) to press stress isolator 8 and attached MEMS 12 down completely on "face" seal 36. Next, second crimper 30 is used to place collar 10 above stress isolator 8 so that its walls extend around the outer wall of cavity 24. Next, second crimper 30 is used to exert pressure on collar 10 (for example and without limitation, a pressure of about 2 tons psi) so that the walls of cavity 24 are crimped down on "face" seal 36 and stress isolator 8. In response, "face" seal is deformed and it fills gaps (it is believed to have "melted") between a bottom surface of stress isolator 8 and surfaces of the inner walls of cavity 24, and the walls of cavity 24 are crimped down on stress isolator 8 to provide a retaining force therefor within housing 22. As a result, "face" seal 36 has been deformed to provide a hermetic and airtight seal in cavity 24 of housing 22 between the bottom surface of stress isolator 8, "face" seal 36, and the inner wall of cavity 24.

Embodiments described above are exemplary. For example, numerous specific details are set forth such as parts, dimensions, temperature ranges, materials, mechanical design, etc. to provide a thorough understanding of the present invention. However, as one having ordinary skill in the art would recognize, the present invention can be practiced without resorting to the details specifically set forth. As such, many changes and modifications may be made to the description set forth above by those of ordinary skill in the art (i.e., various refinements and substitutions of the various embodiments are possible based on the principles and teachings herein) while remaining within the scope of the invention. In addition, materials, methods, and mechanisms suitable for fabricating embodiments have been described above by providing specific, non-limiting examples and/or by relying on the knowledge of one of ordinary skill in the art. Materials, methods, and mechanisms suitable for fabricating various embodiments or portions of various embodiments described above have not been repeated, for sake of brevity, wherever it should be well understood by those of ordinary skill in the art that the various embodiments or portions of the various embodiments could be fabricated utilizing the same or similar previously described materials, methods or mechanisms. As such, the scope of the invention should be determined with reference to the appended claims along with their full scope of equivalents.

What is claimed is:

1. A method for sealing a sensor to a housing comprising:
providing a housing with a top and bottom and a hole that passes through the housing from the top to the bottom wherein the housing further comprises a first cavity that extends down into the housing from the top and is coaxial with the hole and wherein the housing further comprises a second cavity that extends down into the housing from the top and surrounds, and is coaxial with, the first cavity such that a cavity wall is formed between the first cavity and the second cavity;
pressing a cylindrically shaped radial seal with an axial height greater than a radial thickness inside the first cavity such that an outer wall of the radial seal fits against an inside surface of the cavity wall;
providing an isolation member coupled to the sensor;
placing the isolation member down into the radial seal within the first cavity;
placing a collar down into the second cavity of the housing and pressing the collar down such that it deforms the cavity wall and seals the housing to the isolation member.

2. The method of claim 1, wherein the radial seal is a soft metal seal.

3. The method of claim 2 wherein the soft metal is soft copper.

4. The method of claim 3 wherein the housing is comprised of one or more of stainless steel, brass and aluminum.

5. The method of claim 2 wherein the soft metal is a soft copper alloy.

6. The method of claim 2 wherein the radial seal fits snugly inside the cavity wall.

7. The method of claim 6 wherein the sensor is a pressure sensor.

8. The method of claim 2 wherein the collar is pressed down with approximately 2 tons per square inch of pressure.

9. The method of claim 8 wherein the sensor is a pressure sensor.

10. The method of claim 1 wherein the seal is pressed down with approximately 0.5 tons per square inch of pressure.

11. The method of claim 10 wherein the collar is comprised of steel.

12. The method of claim 11 wherein the steel is high strength stainless steel.

13. The method of claim 1 wherein the sensor is a MEMS sensor.

14. The method of claim 1 wherein the housing is cylindrically shaped.

15. A method for sealing a sensor to a housing comprising:
providing a housing with a top and bottom and a hole that passes through the housing from the top to the bottom wherein the housing further comprises a first cavity that extends down into the housing from the top and is coaxial with the hole and wherein the housing further comprises a second cavity that extends down into the housing from the top and surrounds, and is coaxial with, the first cavity such that a cavity wall is formed between the first cavity and the second cavity;
pressing a cylindrically shaped radial seal inside the first cavity such that an outer wall of the radial seal fits against an inside surface of the cavity wall;
providing an isolation member coupled to the sensor;
placing the isolation member down into the radial seal within the first cavity;
placing a collar down into the second cavity of the housing and pressing the collar down such that it crimps the cavity wall against the isolation member and seals the housing to the isolation member with the radial seal.

16. The method of claim 15, wherein the cavity wall is cylindrically shaped.

17. The method of claim 15 wherein the collar is pressed down with approximately 2 tons per square inch of pressure.

18. A method for sealing a sensor to a housing comprising:
providing a housing with a top and bottom and a hole that passes through the housing from the top to the bottom wherein the housing further comprises a first cavity that extends down into the housing from the top and is coaxial with the hole and wherein the housing further comprises a second cavity that extends down into the housing from the top and surrounds, and is coaxial with, the first cavity such that a cylindrical vertical cavity wall is formed between the first cavity and the second cavity;
pressing a cylindrically shaped radial seal with a thickness less than a width of the second cavity inside the first cavity such that an outer wall of the radial seal fits against an inside surface of the cavity wall;
providing an isolation member coupled to the sensor;
placing the isolation member down into the radial seal within the first cavity;
placing a collar down into the second cavity of the housing and pressing the collar down such that it deforms the cavity wall and deforms the seal and seals the housing to the isolation member.

19. The method of claim 18 wherein the collar is pressed down with approximately 2 tons per square inch of pressure.

20. The method of claim 18 wherein the radial seal is made of copper.

* * * * *